US005591484A

United States Patent [19]
Poncelet et al.

[11] Patent Number: 5,591,484
[45] Date of Patent: Jan. 7, 1997

[54] PROCESS FOR MANUFACTURING LAYERS OF DIAMOND DOPED WITH BORON

[75] Inventors: Olivier J. C. Poncelet; Jean-Jacques E. Garenne, both of Chalon, France

[73] Assignee: Eastman Kodak Company, Rochester, N.Y.

[21] Appl. No.: 537,483

[22] Filed: Oct. 2, 1995

[30] Foreign Application Priority Data

Nov. 30, 1994 [FR] France .................................. 94 14612

[51] Int. Cl.$^6$ .............................. C23C 16/00; B05D 3/06
[52] U.S. Cl. ..................... 427/249; 427/255.2; 427/577
[58] Field of Search .................................... 427/249, 577, 427/255.2; 437/233; 423/446; 428/408

[56] References Cited

U.S. PATENT DOCUMENTS 4,740,263  4/1988  Imai et al. ................................ 156/613

FOREIGN PATENT DOCUMENTS 0402039  12/1990  European Pat. Off. .
0509875  10/1992  European Pat. Off. .

OTHER PUBLICATIONS

Murakana et al, "Cathodoluminescence Properties of Diamond Films Synthesized by Microwave Plasma Assisted CVD", Apr. 15, 1991, No. 2, pp. 299–311.

Primary Examiner—Roy V. King
Attorney, Agent, or Firm—John R. Everett

[57] ABSTRACT

The present invention concerns a process for manufacturing conductive diamond layers, in particular layers of diamond doped with boron which are obtained by chemical vapour deposition (CVD).

The process of the invention consists of forming a layer of diamond doped with boron using amino-borane compounds.

These boron compounds are of particular interest since they are non-toxic and easy to manipulate.

16 Claims, 3 Drawing Sheets

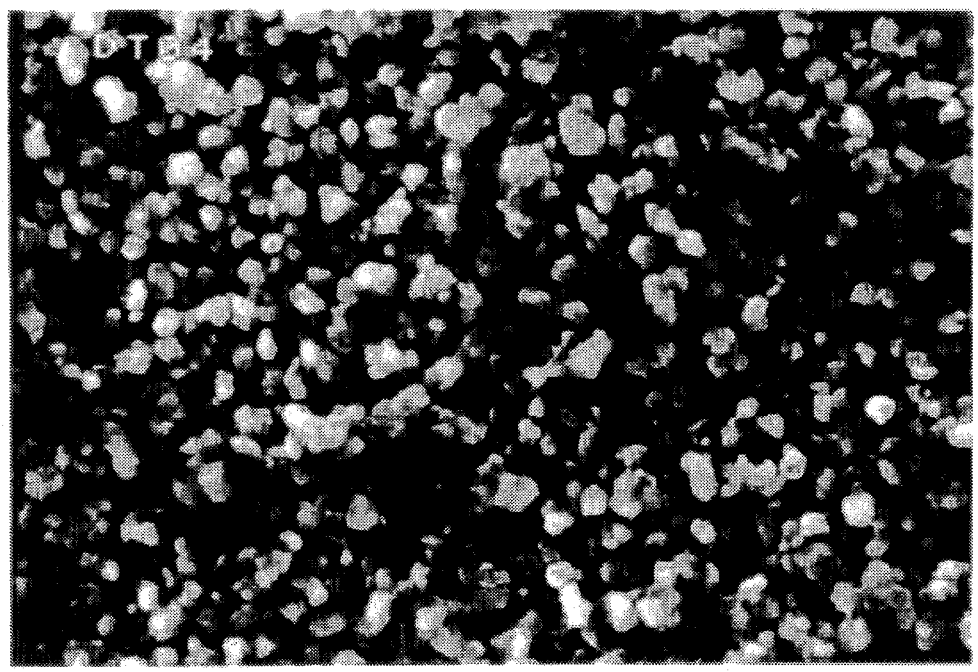
FIG. 3  |―――| 10 μm

PROCESS FOR MANUFACTURING LAYERS OF DIAMOND DOPED WITH BORON

The present invention concerns a process for manufacturing conductive diamond layers, in particular layers of diamond doped with boron which are obtained through chemical vapour deposition (CVD).

For many years, the synthesis of diamond from a carbon source such as graphite subjected to a pressure greater than 50 kbar and a temperature above 1200° C. in the presence of a metallic catalyst such as nickel, cobalt or iron has been known. However, the diamond produced by this technique still contains traces of metallic catalyst.

It is also possible to synthesize diamond by the technique of chemical vapour deposition (CVD). This technique consists of applying, to a gaseous mixture consisting of hydrogen and a source of carbon such as a hydrocarbon, sufficient energy to decompose the hydrogen into atomic hydrogen, the carbon source into active carbon ions, into carbon atoms or into CH free radicals, and depositing these different species on a support, where the diamond is formed.

The decomposition of the gas can be effected by different techniques.

For example, the so-called "plasma enhanced CVD" technique (PECVD) according to which a reactor is used formed principally by a chamber able to be closed hermetically and inside which a low pressure can be applied by means of pumps. The component or components that are to be coated are put on a metal support (the support-carrier cathode) connected to a current generator, if necessary through a sealed insulator. The carbon-containing gas containing notably one or more hydrocarbons, most often methane, acetylene, propane or butane, to which hydrogen and/or inert gases, notably argon, are optionally added, can be introduced into the reactor through metering valves while the pumps are in operation. Under required pressure and electrical power conditions, the gas is excited physically and chemically and ionised so that the atoms partly lose their electrons as they are transformed into positive particles, thereby forming a plasma which causes a "cracking" of the gaseous mixture which is deposited on the component to be coated. The volume of plasma is surrounded by a so-called "sheath" zone through which the ions are accelerated (plasma physics). Deposition through this technique has been the subject of publications (see, for example, Klages, *Appl. Phys.* A56 (1993) 513–526).

Another CVD deposition technique consists of a so-called hot filament CVD deposition (HFCVD) (see, for example, Klages, *Appl. Phys.* A56 (1993) 513–526). Thus, for the deposition of diamond layers, an item of equipment is used that typically comprises a water-cooled stainless steel vacuum chamber which is evacuated by means of a two-stage pump. The component to be coated is placed on a support carrier, in the vicinity of which is disposed a filament brought to a temperature of approximately 2000° C., the function of which is to break the gas molecules into elemental molecules which will then be able to be deposited. The filament can, for example, be made of tungsten, tantalum or rhenium.

According to another technique known as the "electron assisted CVD technique" (EACVD), the top part of a support is maintained at a temperature of at least 400° C. in an atmosphere of a gaseous mixture consisting of hydrogen and a hydrocarbon under reduced pressure conditions. The top surface of the support is subjected to a bombardment of electrons which brings about the formation of diamond crystal nuclei on the said surface. The nuclei formed in this way will grow, so as to form a thin layer of diamond.

The field of application of the present invention also embraces all the well known types of vacuum deposition equipment. This equipment has been the subject of numerous publications in the patent literature and consequently does not require any special elaboration.

In the case of the manufacture of conductive diamond layers, it is necessary to dope the diamond which forms these layers in order to render them conductive. In particular, the diamond can be doped with boron.

The formation of boron doped diamond layers from boron compounds such as $BH_3$, $B_2H_6$ or $B_2O_3$ is known. For example, in European patent application EP 518 538, boron doped diamond layers are obtained with a quantity of boron of between 1000 and 4500 ppm from an $H_2/CH_4$ mixture containing $B_2H_6$.

In U.S. Pat No. 4,740,263, boron doped diamond layers are obtained by electron assisted CVD. The process consists of forming and growing diamond crystal nuclei on a flat support, under a bombardment of electrons and in a gaseous mixture of hydrogen, hydrocarbons and traces of diborane in a reaction chamber kept at reduced pressure.

The problem with such an approach lies principally in the fact that the $BH_3$ dimerizes rapidly into $B_2H_6$, which polymerises in the form of stable polyborane. The formation of these polyboranes may compete directly with the doping of the diamond. Furthermore, borane and diborane are particularly toxic substances, which entails costly safety equipment for their handling.

When the layers of doped diamond are prepared by hot filament CVD deposition, the use of boron oxide leads to a rapid oxidation of the filament. Furthermore, the presence of oxide in the reaction chamber leads to the formation of insulating oxide on the support.

European patent application EP-A-509 875 describes a process for obtaining hard layers of pseudo-diamond which have an amorphous structure mid-way between graphite and diamond. According to the technique described in this document, the layers are obtained from a gaseous mixture containing, amongst other things, very high quantities of boron compounds (between 1 and 50%). In this application, the possibility of using nitrogen impregnated with borane in the gaseous mixture is envisaged. This impregnated nitrogen is obtained by bubbling the nitrogen through a reservoir of triethylamino-borane. In this technique, the amino-borane is only an intermediate which does not play a direct part in the chemical deposition process. Weakly conductive layers of pseudo-diamond are obtained in this way.

Thus one of the objects of the present invention is to produce layers of diamond doped with boron by means of chemical vapour deposition techniques (referred to hereinafter as CVD) from a boron precursor which does not exhibit the drawbacks discussed above in relation to the conventional techniques. In particular, it is of advantage to provide a process for manufacturing conductive diamond layers from a non-toxic, easy to handle boron precursor.

In the following description, reference will be made to FIG. 1, which depicts diagrammatically hot-filament CVD equipment (HFCVD) which can be used according to the present invention and which comprises a reaction chamber (1) equipped with several means for the introduction of reagents. Inside the reaction chamber (1) there are a support carrier (4), a support (3) and a filament (5).

FIG. 3 is an electron micrograph of the crystalline structure of the doped diamond obtained.

Figure 1:
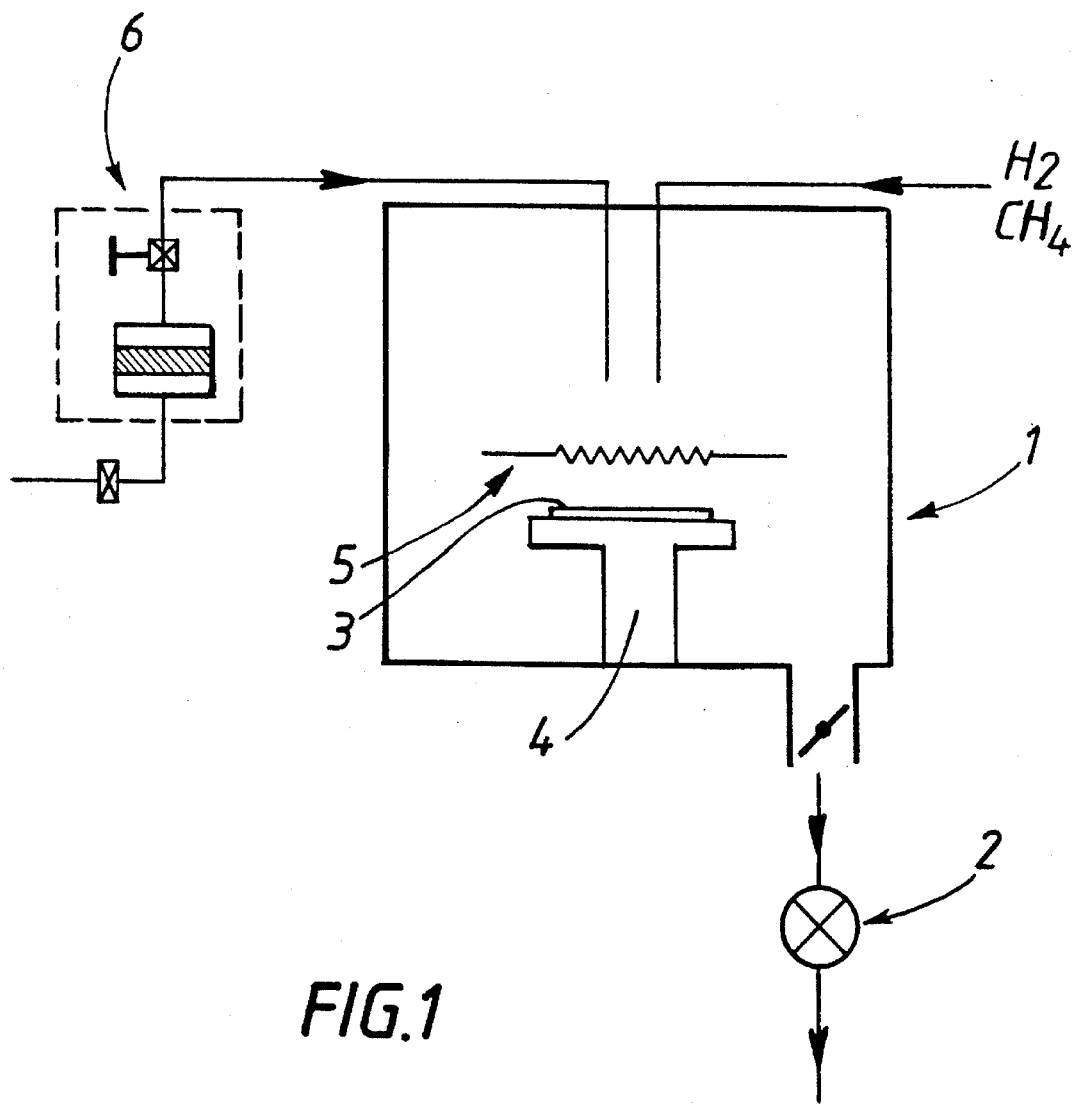

The object of the present invention is achieved by means of a process which consists of forming, on a support placed in a reaction chamber, a boron doped diamond layer from a gaseous mixture consisting of a carrier gas, at least one carbon source and at least one boron precursor, characterised in that the boron precursor is an amino-borane.

According to the invention, the amino-borane type boron precusor has the general formula RR'R"N.BH$_3$ in which R, R' and R" can be either hydrogen, or an alkyl group, substituted or unsubtituted, or an aromatic group with 5 or 6 members, substituted or unsubstituted.

These amino-boranes are, for example, selected from the following compounds: $(CH_3)_3N.BH_3$, $(C_2H_5)_3N.BH_3$, $(CH_3)_2NH.BH_3$, $[(CH_3)_2CH]_2NC_2H_5.BH_3$, $(CH_3)_3CNH_2.BH_3$, $C_6H_5N(C_2H_5)_2.BH_3$ and $(C_5H_4)_3N.BH_3$.

Within the framework of the invention, the steric hindrance created by the substituents of the nitrogen atom of the amino-borane strongly inhibits the formation of polyborane species.

In the majority of cases, these amino-boranes are in solid or viscous liquid form, which enables them to be handled more easily than species in the form of a gas such as $BH_3$ or $B_2H_6$ used in the prior art. Furthermore, these amino-borane compounds are non-toxic.

The amino-borane of the present invention, whether in solid, liquid or gaseous form, can be put directly in the reaction chamber (1).

According to another embodiment, when amino-boranes are used in solid form, the amino-borane can be put in an independent device (6) connected to the reaction chamber (1). In this case, the vapour tension of the amino-boranes is utilized and the amino-borane vapours can either pass naturally into the reaction chamber or be entrained into the reaction chamber by a gas, for example the carrier gas.

Depending on the amino-borane used, the formation of the amino-borane vapours can be activated either by heating the device (6) or by using an agent for activating the amino-borane. This activating agent is a compound which has the behaviour of a Lewis base, for example ammonia, and which, after reaction with the amino-borane, allows, through reduction of the steric hindrance of the amine, the activation of the boron and consequently the optimization of the doping. This reduction in the steric hindrance of the amine of the amino-borane takes place at the last moment, thereby avoiding the formation of polyborane species as described above.

When amino-boranes are used which have a low vapour tension under the reaction conditions, it is preferable to use such an activation agent. This activating agent can be introduced directly into the reaction chamber. When it takes the form of a gas, the activation agent can also be used to entrain the amino-borane vapour from the device (6) to the reaction chamber (1).

According to one embodiment of the invention, the activating agent is ammonia, which performs this role according to the following equilibrium:

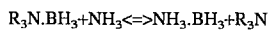

$$R_3N.BH_3 + NH_3 \Longleftrightarrow NH_3.BH_3 + R_3N$$

The quantity of this activating agent depends on the CVD technique used, in particular the reaction temperature, and on the amino-borane used. Preferably, the quantity of this activating agent in the reaction chamber (1) is between 0.01 and 1% (vol).

Within the framework of the present invention, the carbon source consists of one or more hydrocarbons such as methane, propane, butane, acetylene, unsaturated hydrocarbons, alcohols, ketones, etc. Methane is frequently used.

The carrier gas, which can be reactive and/or vehicule, constitutes the majority gas of the mixture. This carrier gas is generally hydrogen, which is essential to the formation of the diamond. The carrier gas can also contain, in addition to hydrogen, an inert gas such as argon, helium or xenon. In certain cases, it can be advantageous to introduce a small quantity of oxygen into the reaction chamber.

The carrier gas and the carbon source can be introduced into the reaction chamber in a mixture or separately.

According to one embodiment, the gaseous mixture inside the reaction chamber consists of 0.5% to 10% (vol) of carbon source, preferably methane, and a quantity of amino-borane less than or equal to 1% (vol), the remainder of the 100% being represented by the carrier gas, preferably hydrogen.

The support upon which the deposition of a boron doped diamond layer can be effected can be any support resistant to at least 600° C. This support can be a metal, alloy, ceramic or carbon support or one made from a composite material. For example, the support may be a support made from silicon, doped or otherwise, titanium or titanium oxide, molybdenum, tungsten, copper, cobalt, chromium, nickel, tantalum, zirconium or niobium.

According to the invention, the process for manufacturing the boron doped diamond layers can be implemented with any known chemical deposition technique such as, for example, the hot filament CVD technique (HFCVD), the plasma enhanced CVD technique (PECVD) or the electron assisted CVD technique (EACVD).

When they are obtained on a conductive support made of doped silicon or titanium, the layers of boron doped diamond can be used to produce diamond electrodes. These diamond electrodes are particularly efficacious in the electro-oxidation of photographic baths.

Because of their high chemical stability, the boron doped layers of diamond of the invention can also be used in electronics or optoelectronics, for example for the manufacture of diodes.

EXAMPLE

The diamond layers doped with boron of the invention were obtained by hot filament CVD. Typically, the device for the implementation of this technique described in FIG. 1 comprises a stainless steel vacuum chamber 1. Means (not shown) are provided for cooling the chamber 1, which vacuum chamber is evacuated by means of a two-stage pump 2. The support to be coated 3 is laid on a support carrier 4 in the vicinity of which a tungsten or tantalum filament 5 is disposed, which is brought to a temperature of approximately 2000° C. and whose function is to break the gas molecules into elements that will then be able to be deposited. The filament is fixed between two copper electrodes. The intensity of the current is kept constant and depends on the length and nature of the filament. Generally, the distance between the filament and the support is approximately 10 mm. A gaseous mixture containing hydrogen, methane and amino-borane, and optionally ammonia, is used. The filament and the support are first heated to temperatures below the deposition temperature, which is approximately 800° C. in a hydrogen atmosphere (with a pressure of approximately 60 mbar). The methane is then introduced into the reaction chamber. The amino-borane responsible for the doping can be introduced into the reaction chamber at the same time, or staggered with respect to the $H_2/CH_4$ gaseous mixture.

An optional vaporisation device 6 can be used with an amino-borane in solid form. The device 6 can be a simple thermostatically-controlled enclosure or a sublimater.

Example 1

The device and the operating method described above are used. A silicon support is placed in the reaction chamber.

The trimethylamino-borane is placed in the device 6, which is maintained at room temperature. The amino-borane vapours pass naturally into the reaction chamber.

Over 6 hours, hydrogen and methane are introduced into the reaction chamber, which is maintained at 800° C. with a filament temperature of 2000° C. in order to obtain in the reaction chamber a gaseous mixture consisting primarily of hydrogen, with approximately 2% of methane and trimethylamino-borane.

Figure 2:
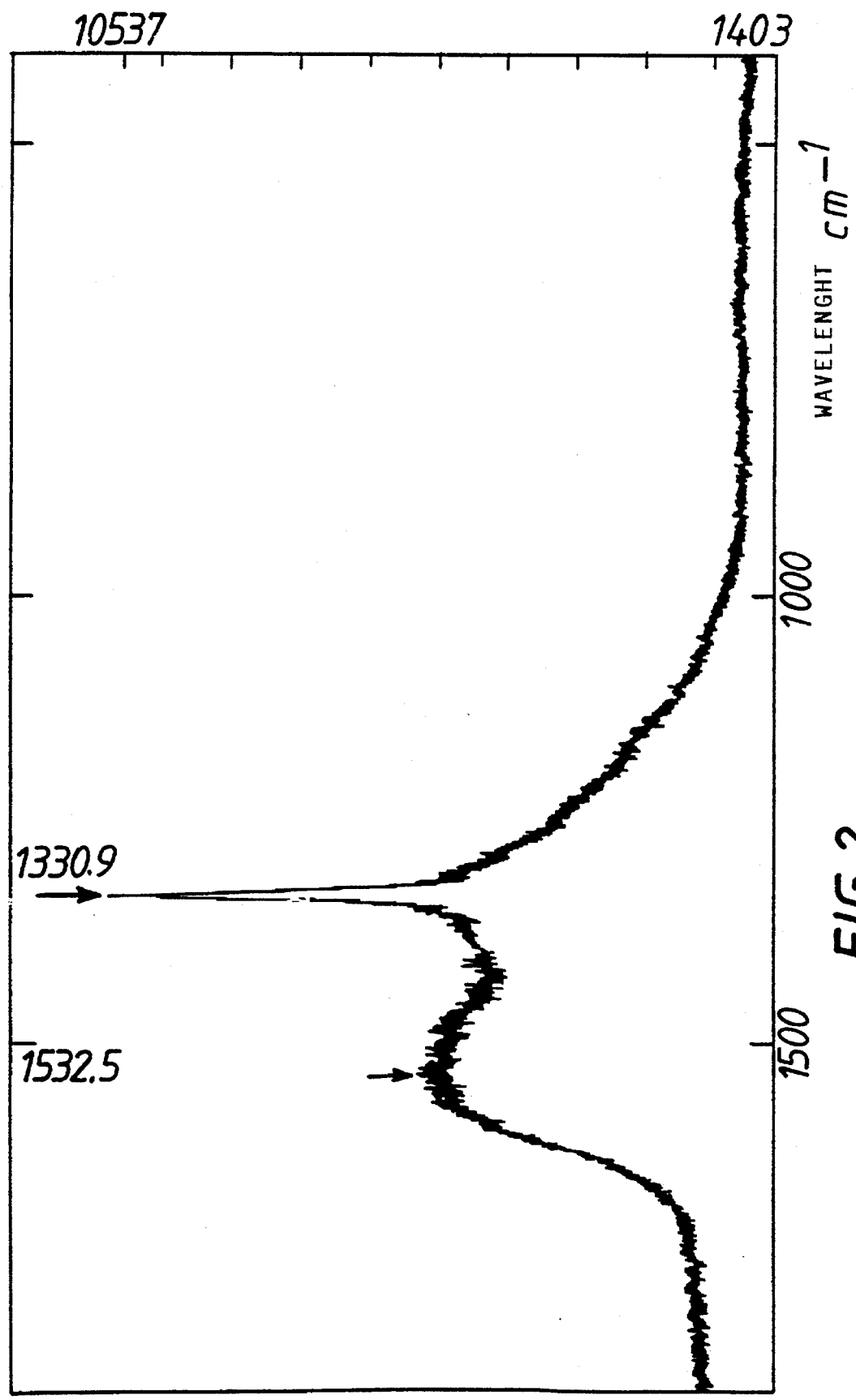
FIG. 2 is a Raman spectrum of the doped diamond layers obtained through the present process.

The Raman spectrum (FIG. 2) of the diamond layer obtained shows the crystalline structure of the diamond.

The conductivity of such a layer is 19 ohms/cm.

By the same operating method, diamond layers doped with boron were obtained on supports made of doped silicon or titanium and having conductivities of between 19 and 38 ohms/cm.

Example 2

The same experiment is carried out as in Example 1, but entraining the amino-borane vapours from the device (6) towards the reaction chamber (1) by the passage of gaseous $NH_3$.

It is apparent that, in this case, the activating agent enables the required quantity of amino-borane to be reduced.

The Raman spectrum is identical to that obtained previously. The electron micrograph (FIG. 3) shows the crystalline structure of the diamond.

We claim:

1. Process for manufacturing diamond doped with boron by chemical vapor deposition, which consists of forming on a support (3) placed in a reaction chamber (1) a diamond layer doped with boron using a gaseous mixture consisting of a carrier gas, at least one source of carbon and at least one boron precursor, the improvement wherein the boron precursor is an amino-borane.

2. Process according to claim 1, in which the gaseous mixture additionally contains an amino-borane activating agent behaving as a Lewis base.

3. Process according to claim 1 or 2, in which the amino-borane compound has the general formula $RR'R''N.BH_3$ in which R, R' and R'' is either hydrogen, or an alkyl group, substituted or otherwise, or an aromatic group with 5 or 6 members, substituted or otherwise.

4. Process according to claim 3, in which the amino-borane compound is selected from the group consisting of $(CH_3)_3N.BH_3$, $(C_2H_5)_3N.BH_3$, $(CH_3)_2NH.BH_3$, $[(CH_3)_2CH]_2NC_2H_5.BH_3$, $(CH_3)_3CNH_2.BH_3$, $C_6H_5N(C_2H_5)_2.BH_3$ and $(C_5H_4)_3H.BH_3$.

5. Process according to claim 1, in which the amino-borane compound, in solid, liquid or gaseous form, is introduced directly into the reaction chamber (1).

6. Process according to claim 1, in which the amino-borane compound in solid or liquid form is placed in a vaporization device (6) connected to the reaction chamber (1) and in which the amino-borane vapors pass into the reaction chamber.

7. Process according to claim 6, in which the amino-borane compound in solid or liquid form is placed in a vaporization device (6) connected to the reaction chamber (1) and in which the amino-borane vapors are entrained into the reaction chamber (1) by an entrainment gas.

8. Process according to claim 7, in which the gas for entraining the amino-borane is the activating agent.

9. Process according to claim 2, in which the activating agent is ammonia.

10. Process according to any one of the preceding claims, in which the gaseous mixture inside the reaction chamber (1) consists of 0.5 to 10% vol of carbon source, a quantity of amino-borane greater than 0 and less than or equal to 1% vol, and optionally 0.01 to 1% of agent for activating amino-borane, the remainder of the 100% being represented by the carrier gas.

11. Process according to claim 10, in which the carbon source is methane.

12. Process according to claim 10, in which the carrier gas is hydrogen.

13. Process according to claim 1, in which the support is a heat-proof conductive support at a temperature of at least 600° C.

14. Process according to claim 1, in which the deposition is carried out using the plasma enhanced CVD technique (PECVD).

15. Process according to claim 1, in which the deposition is carried out using the hot filament CVD technique (HFCVD).

16. Process according to claim 1, in which the deposition is carried out using the electron assisted CVD technique (EACVD).

* * * * *